United States Patent
Nagaraj et al.

(10) Patent No.: US 6,369,726 B1
(45) Date of Patent: Apr. 9, 2002

(54) FAST ACTING POLARITY DETECTOR

(75) Inventors: Krishnaswamy Nagaraj, Somerville; Shanthi Y. Pavan, Piscataway, both of NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/660,816

(22) Filed: Sep. 13, 2000

(51) Int. Cl.[7] ............................................... H03M 1/00
(52) U.S. Cl. ...................................... 341/122; 341/155
(58) Field of Search ............................. 341/122, 155, 341/156, 151

(56) References Cited

U.S. PATENT DOCUMENTS 5,184,128 A * 2/1993 Snow ......................... 341/128
6,232,907 B1 * 5/2001 Nagaraj et al. ............. 341/159

* cited by examiner

*Primary Examiner*—Peguy JeanPierre
(74) *Attorney, Agent, or Firm*—Dwight N. Holmbo; Wade James Brady, III; Frederick J. Telecky, Jr.

(57) ABSTRACT

A fast acting polarity detector uses a "very fast" polarity detector in tandem with a "precise" polarity detector to increase the maximum speed achievable from an A/D converter that employs a 1-bit folding front end. The fast polarity detector is a coarse polarity detector that immediately controls the 1-bit folder. The precise polarity detector operates more slowly, but more accurately. When the output of the precise polarity detector becomes available, it overrides the output of the fast polarity detector. This process does not limit the speed of the A/D conversion even though the precise polarity detector is slower to operate since the signal levels are small.

19 Claims, 2 Drawing Sheets

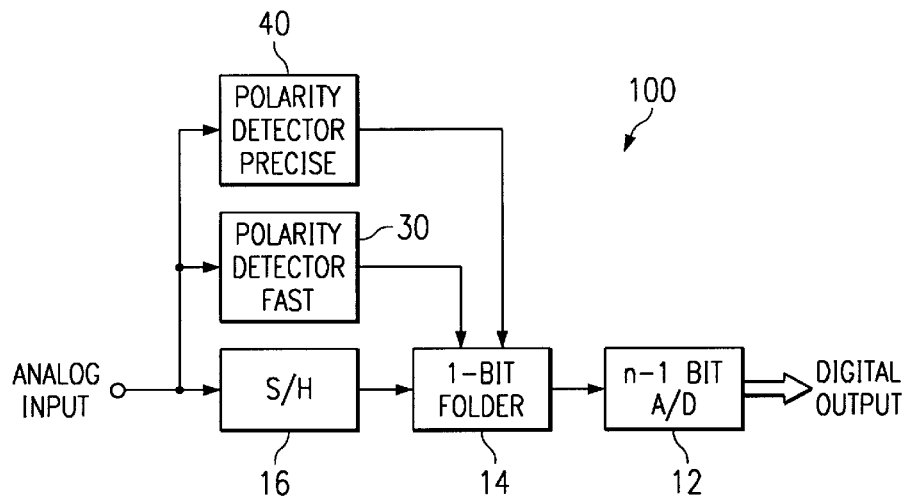
FIG. 2
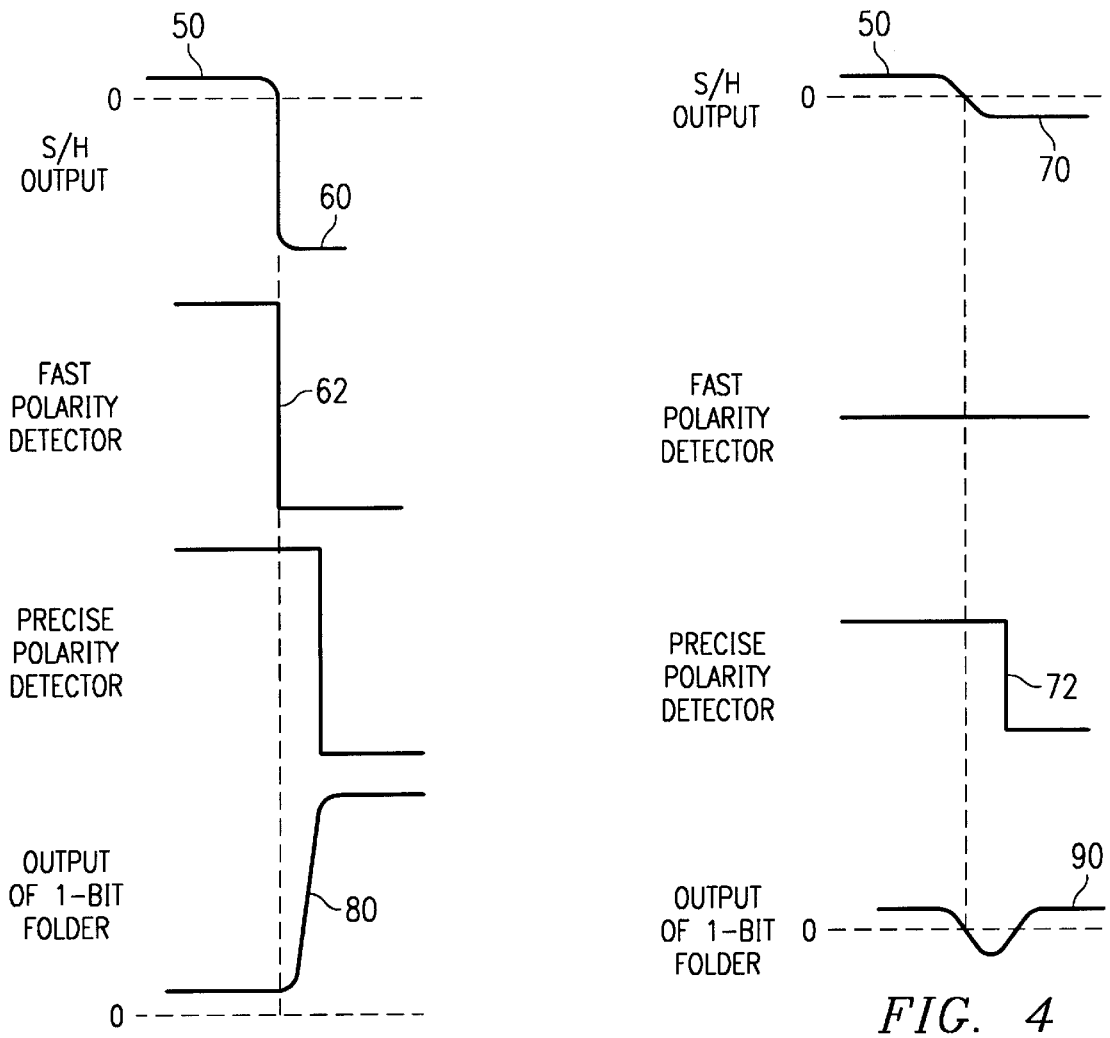
FIG. 3
FIG. 4

FAST ACTING POLARITY DETECTOR

BACKGROUND OF THE INVENTION

1. Field of the Invention

This invention relates generally to signal processing systems and methods, and more particularly to a method and system for increasing the maximum speed achievable from an A/D converter employing a 1-bit folding front end.

2. Description of the Prior Art

Video application techniques are constantly being improved and require increasingly faster methods and systems to support the newer applications. One device that can be used to support fast video applications is a flash analog-to-digital (A/D) converter that has a 1-bit folding front end. A solution that can be used to increase the speed of such a device employs a polarity detector to detect whether an input sample is positive or negative. The 1-bit folder uses the output of the polarity detector to reverse the polarity of a sample/hold device whenever the input sample is negative. In this way, the A/D converter only sees positive signals, which reduces by one-half, the number of comparators required by the A/D converter.

The foregoing solution requires that any polarity detection scheme be very precise. Any errors can cause the 1-bit folder to operate improperly, resulting in negative input signals at the comparator array. This solution will therefore require additional comparators to process the negative signals, which undesirably increases integrated circuit (IC) surface area and power requirements.

In view of the foregoing, a need exists for a polarity detection scheme that is precise as well as fast and that minimizes polarity detection errors sufficiently to eliminate any necessity to employ additional comparators associated with a flash A/D using a folding front-end.

SUMMARY OF THE INVENTION

The present invention is directed to a fast acting polarity detection system and method to increase the speed of a flash A/D converter that employs a folding front-end. According to one embodiment, a system includes a single n−1 bit flash A/D converter that receives input signals from a 1-bit folder. An input signal is first sampled and held by a sample and hold circuit. Simultaneously, a very fast polarity detector (zero crossing detector) detects whether the input signal is positive or negative and immediately controls the 1-bit folder. The 1-bit folder, which is actually a polarity reverser, uses the output of the polarity detector to reverse the polarity of the sample and hold output signal whenever the signal is negative. The A/D will therefore see only positive signals, which reduces the number of comparators required for signal processing by one-half. The very fast polarity detector is a coarse polarity detector that operates to increase the speed of the flash A/D. A more precise polarity detector that provides a higher level of accuracy is also employed such that when the output of the precise polarity detector becomes available, it overrides the output of the fast polarity detector to eradicate any erroneous signals produced by the very fast polarity detector. This technique does not adversely affect the speed of the A/D since potential signal errors only occur at small signal levels due to device imperfections such as those associated with offset voltages, even though the precise polarity detector operates more slowly than the very fast polarity detector.

In one aspect of the invention, a technique is implemented to increase the operating speed of a flash A/D converter that reduces by one-half the number of comparators required by the A/D converter.

In another aspect of the invention, a technique is implemented to increase the operating speed of a flash A/D converter beyond operating speeds capable using presently known architectures.

In yet another aspect of the invention, a technique is implemented to increase the operating speed of a flash A/D converter while simultaneously minimizing IC surface area and power requirements necessary to operate the flash A/D converter.

In still another aspect of the invention, a technique is implemented to increase the operating speed of a flash A/D converter with no adverse impact on precision.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein:

FIG. 2 is a block diagram illustrating a flash A/D converter that employs a 1-bit folding front end in association with a tandem polarity detection scheme according to one embodiment of the present invention;

FIG. 3 is a timing diagram depicting operation of the 1-bit folder shown in FIG. 2 when a positive signal sample is followed by a large negative signal sample; and FIG. 4 is a timing diagram depicting operation of the 1-bit folder shown in FIG. 2 when a positive signal sample is followed by a small negative signal sample.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
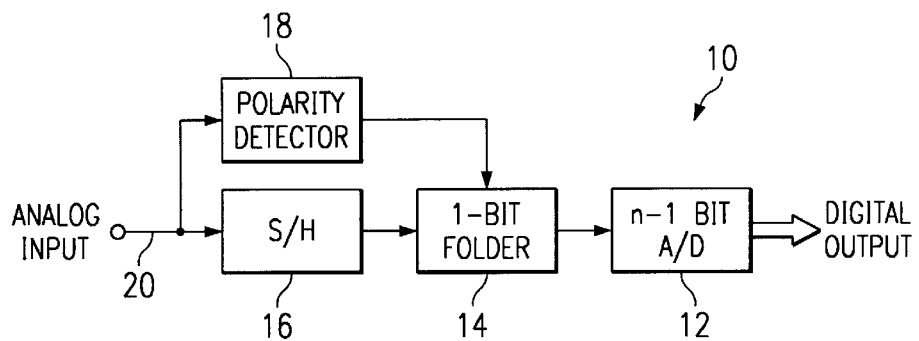
FIG. 1a is a block diagram illustrating a flash A/D converter that employs a 1-bit folding front-end in association with a polarity detector.

FIG. 1 is a block diagram of a system 10 illustrating a flash A/D converter 12 that employs a 1-bit folding front-end 14 in association with a sample-and-hold device 16 and a polarity detector 18; The analog input 20 is sampled and held by a sample-and-hold circuit 16. Simultaneously, a polarity detector 18 (i.e., zero crossing detector) detects whether the analog signal is positive or negative. The 1-bit folder 14 (polarity reverser) then uses the output of the polarity detector 18 to reverse the polarity of the sample-and-hold circuit 16 whenever the signal is negative. The A/D converter 12 therefore only sees positive signals. This feature effectively reduces the number of comparators by one-half that are required to implement the 1-bit folder 14. An n−1 bit A/D converter 12 is adequate since the output of the polarity detector itself provides one bit (the most significant bit).

Figure 1B:
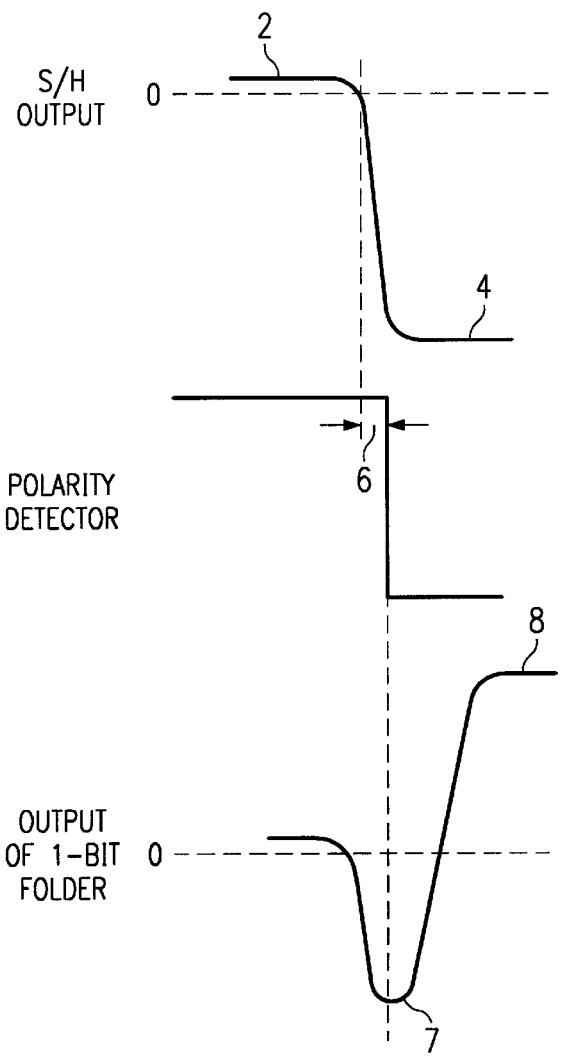
FIG. 1b is a timing diagram depicting operation of the 1-bit folder shown in FIG. 1a when a small positive signal sample is followed by a large negative signal sample.

The above described polarity detection scheme must be very precise since any errors can cause the 1-bit folder 14 to operate improperly, resulting in negative input signals at its comparator array. Any such improper operation can be overcome by introducing additional comparators that can process negative signals. These additional comparators however, undesirably increase IC surface area and power requirements. Error minimization associated with polarity detection is therefore desirable and necessary. However, it is difficult to realize a polarity detector that is precise and also fast. A high precision polarity detector generally tends to operate slowly. To illustrate how this would affect the 1-bit folding operation, consider a case where a small positive input is followed by a large negative input. The waveforms for this are shown in FIG. 1*b*. When the input makes its transition from a small positive value 2 to a large negative value 4, the output of the polarity detector 18 initially continues to hold the value corresponding to the previous input. Thus, the output of the polarity detector 18 reverses (1-bit folder 14) starts going negative. When the polarity detector 18 makes its decision after a delay 6, the 1-bit folder 14 reverses its output. Thus, its output has to change from a relatively large negative value 7 to a large positive value 8. This reduces down the maximum speed of operation of the 1-bit folder 14.

FIG. 2 is a block diagram of a system 100 illustrating a flash A/D converter 12 that employs a 1-bit folding front end (folder) 14 in association with a tandem polarity detection scheme according to one embodiment of the present invention. The tandem polarity detection scheme uses both a fast polarity detector 30 and a slower, more precise polarity detector 40 to implement a system 100 that is both precise and fast. The fast polarity detector 30 is a coarse polarity detector that operates at very fast speeds. It immediately controls the 1-bit folder 14. The precise polarity detector 40 operates more slowly, but also more accurately. When the output of the precise polarity detector 40 becomes available, it overrides the output of the fast polarity detector 30. A more detailed discussion of system 100 operating principles is now set forth with reference to FIGS. 3 and 4.

FIG. 3 is a timing diagram depicting operation of the 1-bit folder 14 shown in FIG. 2 when a positive signal sample 50 is followed by a large negative signal sample 60. Because the negative signal sample 60 is large, the fast polarity detector 30 makes the correct decision as shown by signal 62. In this case, the precise polarity detector 40 has no effect on the 1-bit folder 14 output signal 80.

FIG. 4 is a timing diagram depicting operation of the 1-bit folder 14 shown in FIG. 2 when a positive signal sample 50 is followed by a small negative signal sample 70. In this case, if the fast polarity detector 30 makes the correct decision, then there is no effect due to the precise polarity detector 40, as in the case described above with reference to FIG. 3. Because the negative input signal sample 70 is small however, the fast polarity detector 30 can make a wrong decision due to manufacturing imperfections such as those regarding offset voltages. If this occurs, the 1-bit folder 14 initially produces the wrong output. When the precise polarity detector 40 makes its decision a little later as seen by signal 72, it overrides the polarity reverser (1-bit folder 14), and the output signal 90 changes from being a negative signal to a positive signal (correct value). Because the negative signal 70 level is small, this process does not limit the speed of the A/D conversion process 100, although the precise polarity detector 40 is slower to operate in comparison with the fast polarity detector 30.

In view of the above, it can be seen the present invention presents a significant advancement in the art of A/D conversion technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow. For example, although various embodiments have been presented herein with reference to particular functional architectures and characteristics, the present inventive structures and characteristics are not necessarily limited to particular detection circuit architectures or sets of characteristics as used herein. It shall be understood the embodiments described herein above can easily be implemented using diverse signal processing elements so long as the combinations achieve fast acting polarity detection according to the inventive principles set forth herein above.

What is claimed is:

1. A polarity detection system comprising:
   a sample-and-hold circuit having an input and an output;
   a 1-bit folder having an output and an input in communication with the sample-and-hold circuit output;
   a fast polarity detector having an input and an output in communication with the 1-bit folder; and
   a precise polarity detector having an input and an output in communication with the 1-bit folder, wherein the sample-and-hold circuit, fast polarity detector and precise polarity detector are operational to receive a common analog input signal at their inputs, and further wherein the fast polarity detector and the precise polarity detector are operational to control the output of the 1-bit folder in response to the common analog input signal such that negative signals provided at the sample-and-hold circuit output are converted to positive signals by the 1-bit folder.

2. The polarity detection system according to claim 1 further comprising an A/D converter having an input in communication with the 1-bit folder output.

3. The polarity detection system according to claim 2 wherein the A/D converter is a flash A/D converter.

4. The polarity detection system according to claim 2 wherein the A/D converter is a n–1 bit A/D converter, wherein n represents a most significant bit.

5. The polarity detection system according to claim 4 wherein at least one of the polarity detectors is further operational to generate the most significant bit.

6. A polarity detection system comprising:
   means for sampling and holding an analog input signal;
   means for reversing the polarity of an analog input signal held by the sampling and holding means;
   first means for controlling the polarity reversing means; and
   second means for controlling the polarity reversing means, wherein the means for sampling and holding, first means and second means are operational to receive a common analog input signal and control the polarity reversing means in response thereto such that the polarity reversing means can generate only positive signals.

7. The polarity detection system according to claim 6 wherein the reversing means is a 1-bit folder.

8. The polarity detection system according to claim 6 wherein the first controlling means is a fast speed polarity detector.

9. The polarity detection system according to claim 8 wherein the second controlling means is a precise polarity detector.

10. The polarity detection system according to claim 6 wherein the first controlling means is operational to receive a common analog input signal and control the polarity reversing means in response thereto such that the polarity reversing means can substantially generate positive signals and further wherein the second controlling means is operative to receive the common analog input signal and override the first controlling means such that the polarity reversing means can generate only positive signals when the first controlling means fails to cause the polarity reversing means to generate positive signals.

11. The polarity detection system according to claim 6 further comprising analog-to-digital (A/D) converting means for receiving the positive signals and generating a digital word therefrom.

12. The polarity detection system according to claim 11 wherein the A/D converting means comprises a n−1 bit A/D converter, wherein n is a most significant bit.

13. The polarity detection system according to claim 12 wherein at least one of the controlling means is further operational to generate the most significant bit.

14. A method of increasing the maximum speed achievable from an A/D having a 1-bit folding front end that comprises a sample-and-hold circuit, a 1-bit folder, a fast polarity detector and a precise polarity detector, the method comprising the steps of:

sampling and holding an analog input signal via the sample-and-hold circuit;

detecting the analog input signal via the fast polarity detector and generating a control signal therefrom to control the 1-bit folder such that the 1-bit folder will reverse the polarity of substantially all negative analog input signal samples held by the sample-and-hold circuit; and detecting the analog input signal via the precise polarity detector and generating a control signal therefrom to control the 1-bit folder such that the 1-bit folder will reverse the polarity of negative analog input signal samples held by the sample-and-hold circuit subsequent to generation of the control signal by the fast polarity detector only when the fast polarity detector generates erroneous control signals.

15. The method according to claim 14 further comprising the step of converting positive signals generated by the 1-bit folder into n−1 bits of a word wherein n is a most significant bit.

16. The method according to claim 15 further comprising the step of converting a control signal generated by at least one polarity detector into the most significant bit n of the word generated by the A/D converter.

17. A method of increasing the maximum speed achievable from an A/D having a 1-bit folding front end comprising the steps of:

sampling and holding an analog input signal;

detecting the polarity of the analog input signal with a fast speed polarity detector and forcing the polarity of the sampled and held signal to a positive value when the fast speed polarity detector senses the polarity is negative; and redetecting the polarity of the analog input signal with a precise polarity detector and forcing the polarity of the sampled and held signal to a positive value when the fast speed polarity detector fails to sense the polarity is negative.

18. The method according to claim 17 further comprising the step of retrieving the positive signal values and converting the positive signal values to a n−1 bit digital word, wherein n is a most significant bit.

19. The method according to claim 18 further comprising the step of retrieving a signal generated by at least one polarity detector and generating the most significant bit n therefrom to formulate an n-bit digital word.

* * * * *